(12) United States Patent
Bailey

(10) Patent No.: US 10,875,430 B2
(45) Date of Patent: Dec. 29, 2020

(54) VEHICLE INTERIOR ASSEMBLIES HAVING LEATHER COVER WITH ELECTRICALLY CONDUCTIVE COATING

(71) Applicant: Lear Corporation, Southfield, MI (US)

(72) Inventor: Christopher Todd Bailey, Warren, MI (US)

(73) Assignee: Lear Corporation, Southfield, MI (US)

( * ) Notice: Subject to any disclaimer, the term of this patent is extended or adjusted under 35 U.S.C. 154(b) by 236 days.

(21) Appl. No.: 15/978,533

(22) Filed: May 14, 2018

(65) Prior Publication Data

US 2019/0344689 A1 Nov. 14, 2019

(51) Int. Cl.

| | |
|---|---|
| *B60N 2/56* | (2006.01) |
| *B60N 2/58* | (2006.01) |
| *B60R 16/02* | (2006.01) |
| *H03K 17/96* | (2006.01) |
| *H05B 3/34* | (2006.01) |
| *H05B 3/36* | (2006.01) |
| *B60R 16/03* | (2006.01) |
| *B60R 13/02* | (2006.01) |
| *B60R 16/023* | (2006.01) |
| *B60Q 3/54* | (2017.01) |
| *B60R 16/027* | (2006.01) |
| *H05B 3/12* | (2006.01) |
| *B62D 1/04* | (2006.01) |

(52) U.S. Cl.
CPC ............. *B60N 2/5685* (2013.01); *B60N 2/58* (2013.01); *B60Q 3/54* (2017.02); *B60R 13/02* (2013.01); *B60R 16/023* (2013.01); *B60R 16/027* (2013.01); *B60R 16/0207* (2013.01); *H03K 17/96* (2013.01); *H05B 3/12* (2013.01); *B60R 2013/0287* (2013.01); *B62D 1/046* (2013.01); *H05B 2203/013* (2013.01); *H05B 2203/029* (2013.01)

(58) Field of Classification Search
None
See application file for complete search history.

(56) References Cited

U.S. PATENT DOCUMENTS

| | | | | |
|---|---|---|---|---|
| 6,093,910 | A | * | 7/2000 | McClintock ......... B60N 2/5685 165/41 |
| 6,545,236 | B2 | | 4/2003 | Valk et al. |
| 7,131,187 | B2 | | 11/2006 | Check et al. |

(Continued)

FOREIGN PATENT DOCUMENTS

| | | |
|---|---|---|
| KR | 20100129652 A | 12/2010 |
| WO | 0170057 A1 | 9/2001 |

*Primary Examiner* — Joseph M. Pelham
(74) *Attorney, Agent, or Firm* — Brooks Kushman P.C.

(57) ABSTRACT

A leather cover for a vehicle interior assembly such as a vehicle seat, a steering wheel, a console, etc. includes a leather layer and an electrically conductive coating applied onto the leather layer. The electrically conductive coating is either applied to a finish side of the leather layer or to a flesh side of the leather layer. The electrically conductive coating may function as: a wire harness component and is connected to wiring of a wire harness system of a vehicle; an electrical resistance heater and is connected to wiring of a heater system of a vehicle; an electrically conductive touch control and is connected to wiring of a control system of a vehicle; or electroluminescent or electrochromic lighting and is connected to wiring of a lighting system of a vehicle.

5 Claims, 3 Drawing Sheets

(56) References Cited

U.S. PATENT DOCUMENTS

| | | | |
|---|---|---|---|
| 7,432,459 B2 | 10/2008 | Stoschek et al. | |
| 8,507,102 B1* | 8/2013 | O'Leary | C14C 11/003 |
| | | | 428/473 |
| 8,723,043 B2 | 5/2014 | Weiss et al. | |
| 9,159,221 B1 | 10/2015 | Stantchev | |
| 9,191,997 B2 | 11/2015 | Weiss | |
| 9,873,446 B2 | 1/2018 | Gardner et al. | |
| 10,272,836 B2 | 4/2019 | Ali et al. | |
| 2002/0104746 A1 | 8/2002 | Valk et al. | |
| 2008/0202912 A1 | 8/2008 | Boddie et al. | |
| 2009/0004478 A1 | 1/2009 | Baetzold et al. | |
| 2009/0051607 A1 | 2/2009 | Ellinger et al. | |
| 2009/0251917 A1 | 10/2009 | Vollner et al. | |
| 2011/0226751 A1* | 9/2011 | Lazanja | H01C 17/06 |
| | | | 219/217 |
| 2011/0284515 A1 | 11/2011 | Akaike et al. | |
| 2012/0113667 A1 | 5/2012 | Brandt et al. | |
| 2013/0249258 A1 | 9/2013 | Kortwig | |
| 2014/0203770 A1 | 7/2014 | Salter et al. | |
| 2016/0202912 A1 | 7/2016 | Iyigun et al. | |
| 2016/0264078 A1 | 9/2016 | McGuire, Jr. et al. | |
| 2017/0074124 A1 | 3/2017 | Weng et al. | |
| 2017/0282956 A1* | 10/2017 | Odate | H05B 3/146 |
| 2017/0341573 A1 | 11/2017 | Gerhard et al. | |
| 2019/0001879 A1* | 1/2019 | Ali | B60K 35/00 |
| 2019/0006872 A1 | 1/2019 | Ali et al. | |
| 2019/0008050 A1 | 1/2019 | Ali et al. | |
| 2019/0077310 A1* | 3/2019 | Scott | B60R 13/02 |
| 2019/0077311 A1* | 3/2019 | Ali | H01L 33/62 |
| 2019/0126853 A1* | 5/2019 | Cannon | H05B 3/20 |
| 2019/0135199 A1 | 5/2019 | Galan Garcia et al. | |
| 2019/0226879 A1* | 7/2019 | Lakatos | B60N 2/5685 |
| 2019/0378637 A1* | 12/2019 | Rispoli | H01C 3/06 |

\* cited by examiner

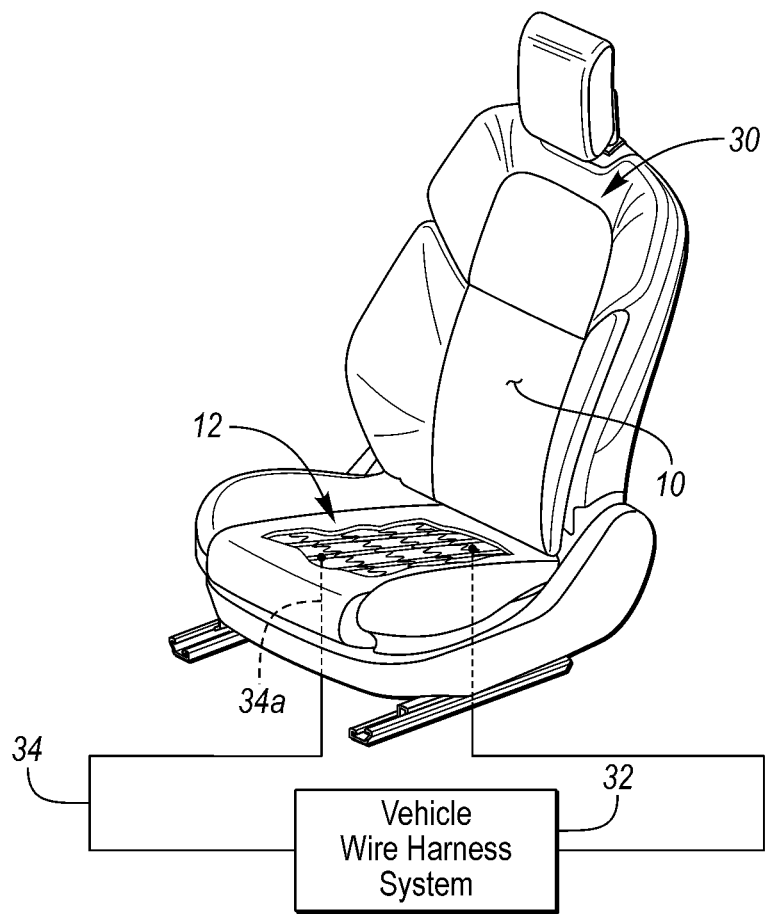
FIG. 2
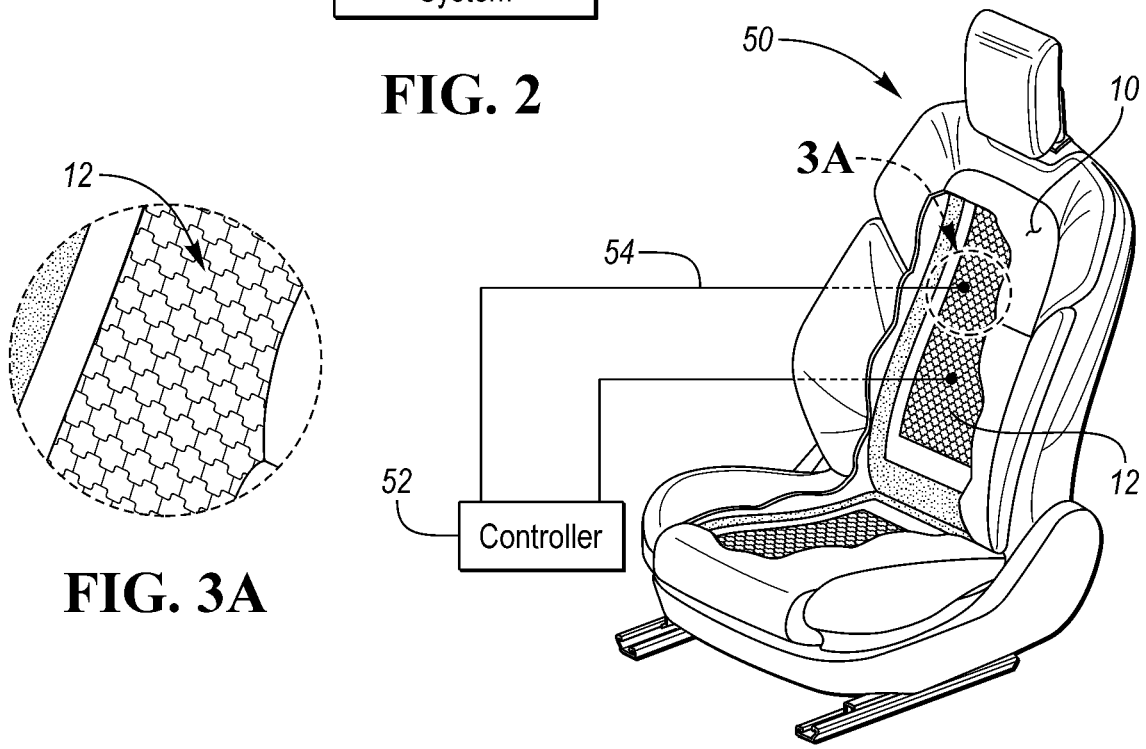
FIG. 3A
FIG. 3

VEHICLE INTERIOR ASSEMBLIES HAVING LEATHER COVER WITH ELECTRICALLY CONDUCTIVE COATING

TECHNICAL FIELD

The present invention relates to vehicle interior assemblies having leather surfaces.

BACKGROUND

Leather is considered to have the benefits of durability, timelessness, style, naturalness, strength, and flexibility.

Vehicle interior assemblies such as vehicle seats have a leather cover. The leather cover is the outer component of the upholstery of a vehicle seat.

A vehicle seat may include conventional wire harness components. Converting the leather cover of the seat into a wire harness component in place of the conventional wire harness components would reduce complexity and bulk weight of the seat.

A vehicle seat may include conventional electrical resistive heating components within the upholstery of the seat. Converting the leather cover of the seat into an electrical resistive heater in place of conventional electrical resistive heating components would enable lower electrical current to be consumed for the same degree of heating due to the closer proximity of the leather cover to the seat occupant's body.

A usable space of a vehicle interior for functional applications such as controls is limited. Incorporating a leather cover onto vehicle interior assemblies such as steering wheels, seating consoles, arm rests, etc., and converting the leather cover into a surface operable for handling such functional applications would increase the usable space of the vehicle interior. Alternatively, converting this leather cover into a surface operable for handling functional applications such as electroluminescent and/or electrochromic lighting would enhance the usable space of the vehicle interior.

SUMMARY

A leather cover for a vehicle interior assembly includes a leather layer and an electrically conductive coating applied onto the leather layer.

The electrically conductive coating may be either applied to a finish side of the leather layer or to a flesh side of the leather layer.

The leather cover may include a base coat on the leather layer, a color coat, and a top coat on the color coat with the electrically conductive coating being between the base coat and the color coat.

The leather cover may include a base coat on a first side of the leather layer, a color coat on the base coat, and a top coat on the color coat with the electrically conductive coating being on a second side of the leather layer opposite to the first side of the leather layer.

A vehicle interior assembly includes an assembly body and a leather cover covering the assembly body. The leather cover has a leather layer and an electrically conductive coating applied onto the leather cover.

The electrically conductive coating may function as: a wire harness component and is connected to wiring of a wire harness system of a vehicle; an electrical resistance heater and is connected to wiring of a heater system of a vehicle; an electrically conductive touch control and is connected to wiring of a control system of a vehicle; or electroluminescent or electrochromic lighting and is connected to wiring of a lighting system of a vehicle.

A first portion of the electrically conductive coating may function as a first electrically conductive touch control and is connected to wiring of the control system of the vehicle and a second portion of the electrically conductive coating may function as a second electrically conductive touch control and is connected to wiring of the control system of the vehicle.

The assembly body may be a vehicle seat, a steering wheel, or a vehicle console.

A vehicle seat includes a seat body and a leather cover covering the seat body. The leather cover has a leather layer and an electrically conductive coating applied onto the leather layer.

In embodiments, a leather cover includes an electrically conductive coating. Specialized polymers and additives are utilized to create the electrically conductive coating. The electrically conductive coating is applied either to the flesh side or the grain side of the leather cover as a thin film or layer. The electrically conductive coating may function as an electrical wire harness, electrically conductive touch control, electrical resistive heater, or electroluminescent or electrochromic lighting. As such, the electrically conductive coating provides "smart surface" functionality or "smart surface technology". The use of leather covers having the electrically conductive coating opens new design elements in vehicle interiors and improves electrically efficiency of vehicle interior assemblies.

In embodiments, the leather covers are of vehicle interior assemblies such as vehicle seats (e.g. seat bottom, seat back, arm rests, bolsters, etc.) which conventionally have leather covers. In other embodiments, the leather covers are of vehicle interior assemblies such as steering wheels, consoles, interior trim surfaces, ceiling surface, and the like which may typically not have leather covers.

In embodiments, the electrically conductive coating is applied to the leather cover of a vehicle seat to provide an enhanced seating electrical seating system (i.e., an enhanced seating "E-System"). The electrically conductive coating functions as a wire harness and is used in place of conventional wire harness components incorporated within the seat. Use of the electrically conducting coating in place of the conventional wire harness components reduces the weight of the electrical seating system.

In embodiments, the electrically conductive coating is applied to the leather cover of a vehicle seat to provide electrical resistance heating functionality. That is, the electrically conducive coating functions as an electrical resistance heater having a plurality of electrical resistance heating elements. By placing the electrical resistance heating elements into the leather cover as a polymer film (i.e., the electrically conductive coating), much lower electrical current is required for the same degree of heating due to the proximity of the leather cover to the seat occupant's body. The heating felt by the seat occupant is not defused by foams or laminates of the seat which otherwise occurs with conventional heating elements located within the upholstery of the seat.

In embodiments, the electrically conductive coating is applied to the leather cover of vehicle interior assemblies such as steering wheels, mid seating consoles, arm rests, etc., to provide electrically conductive touch control functionality. That is, the electrically conducive coating functions as one or more electrically conductive touch controls. By utilizing the electrically conductive coating for electrically conductive touch control functionality, new design elements can be added to these types of vehicle interior assemblies. This, in turn, expands the market for leather.

In embodiments, the electrically conductive coating is applied to the leather cover of vehicle interior assemblies such as steering wheels, mid seating consoles, arm rests, etc., to provide electrical resistance heating functionality. The electrically conducive coating functions as an electrical resistance heater having a plurality of electrical resistance heating elements. The electrical resistance heating elements are placed into the leather cover as a polymer film (i.e., the electrically conductive coating). By utilizing the electrically conductive coating for electrical resistance heating functionality, new design elements can be added to these types of vehicle interior assemblies. This, in turn, further expands the market for leather.

BRIEF DESCRIPTION OF THE DRAWINGS

FIG. 2 illustrates a perspective view of a vehicle seat having a leather cover with an electrically conductive coating, the electrically conductive coating functioning as an electrical wire harness;

FIG. 3 illustrates a perspective view of a vehicle seat having a leather cover with an electrically conductive coating, the electrically conductive coating functioning as an electrical resistive heater;

FIG. 3A illustrates an enlarged view of a portion of the electrically conductive coating of the leather cover of the vehicle seat shown in FIG. 3;

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1A:
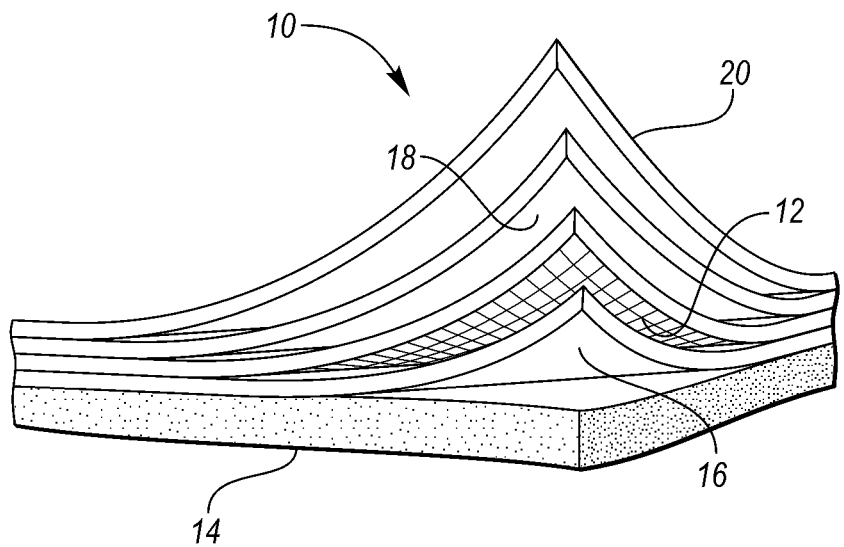
FIG. 1A illustrates a cross-sectional view of a leather cover with an electrically conductive coating, the electrically conductive coating being integrated within the finishing stack of the leather cover pursuant to an embodiment.

Referring now to FIG. 1A, a cross-sectional view of a leather cover 10 with an electrically conductive coating 12 according to an embodiment is shown. Leather cover 10 includes a leather layer 14, a base coat 16, a color coat 18, and a top coat 20. Base coat 16, color coat 18, and top coat 20 are on the finish side of leather layer 14 and form a finishing stack of leather cover 10. Base coat 16 is applied directly on leather layer 14, top coat 20 is the outermost coat of the finishing stack, and color coat 18 is between base coat 16 and top coat 20.

In this embodiment, electrically conductive coating 12 is integrated within the finishing stack of leather cover 10. Particularly, as shown in FIG. 1A, electrically conductive coating 12 is sandwiched between base coat 16 and color coat 18. Color coat 18 should be a strong color coat to mask appearance of electrically conductive coating 12. Top coat 20 is to be capable of insulating a user in contact with leather cover 10 from electrical current traveling through electrically conductive coating 12.

Figure 1B:
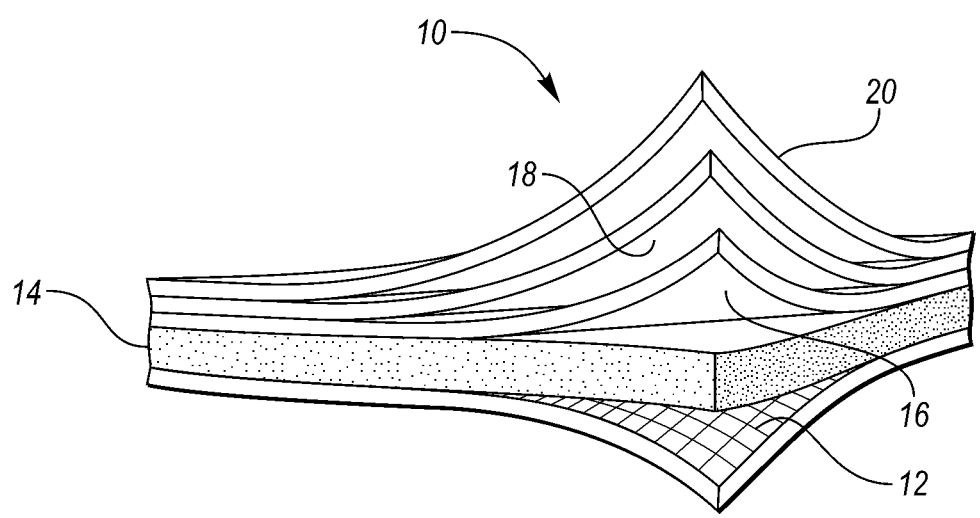
FIG. 1B illustrates a cross-sectional view of a leather cover with an electrically conductive coating, the electrically conductive coating being an add-on to the leather cover pursuant to another embodiment.

Referring now to FIG. 1B, with continual reference to FIG. 1A, a cross-sectional view of leather cover 10 with an electrically conductive coating 12 according to another embodiment is shown. In this embodiment, electrically conductive coating 12 is applied directly on the flesh side of leather layer 14. Particularly, as shown in FIG. 1B, electrically conductive coating 12 is an add-on to leather layer 14.

As indicated in each of FIGS. 1A and 1B, electrically conductive coating 12 is a thin film or layer. Electrically conductive coating 12 can be in the form of graphene/carbon nanotubes, silver/nickel, indium tin oxide, etc.

As will be described herein, adding a thin layer in the form of electrically conductive coating 12 either into the finishing stack of leather cover 10 as shown in FIG. 1A or as part of a flesh coat of leather cover 10 as shown in FIG. 1B enables the leather cover to have a variety of technologies. These technologies include: integrated electrical wire harnesses and integrated touch controls, which relate to control features; integrated resistive heating, which relates to comfort features; and electroluminescent or electrochromic (color changing) lighting, which relate to beauty features. With the application of electrically conductive coating 12 into leather cover 10, the leather cover, in addition to functioning as leather, becomes an electrical device having its own level of additional requirements.

Referring now to FIG. 2, with continual reference to FIGS. 1A and 1B, a perspective view of a vehicle seat 30 having leather cover 10 with electrically conductive coating 12 is shown. Vehicle seat 30 is for use within an interior of a vehicle having a wire harness system 32. Electrically conductive coating 12 functions as an electrical wire harness. Wire harness system 32 includes conventional wiring 34 extending through the vehicle. Electrically conductive coating 12 is connected to conventional wiring 34 and thereby is a part of wire harness system 32. For instance, as indicated in FIG. 2, electrically conductive coating 12 is connected between wires 34a and 34b of conventional wiring 34 to be part of wire harness system 32.

The relatively smaller wire in the form of electrically conductive coating 12 is connected to existing vehicle technology in the form of conventional wiring 34. In this way, electrically conductive coating 12 replaces a part of conventional wiring 34 of wire harness system 32. Integrating electrically conductive coating 12 into leather cover 10 already used for vehicle seat 30 has the potential to reduce the number of components necessary in seating and may help decrease assembly time.

Control and diagnostic electric signals to be communicated over wire harness system 32 can be communicated through electrically conductive coating 12 as the electric signals travel along conventional wiring 34 of the wire harness system. Depending on amperage carrying capacity of electrically conductive coating 12, electrical power electric signals may be communicated through the electrically conductive coating as these electric signals travel along conventional wiring 34 of wire harness system 32.

For instance, a vehicle controller in communication with wire harness system 32 may communicate control electric signals for controlling functions of vehicle seat 30 to seat controls (not shown) of the vehicle seat via electrically conductive coating 12. Seat controls of vehicle seat 30 may communicate diagnostic electric signals indicative of sensed conditions of the vehicle seat to the vehicle controller over wire harness system 32 via electrically conductive coating 12.

Referring now to FIG. 3, with continual reference to FIGS. 1A and 1B, a perspective view of a vehicle seat 50 having leather cover 10 with electrically conductive coating 12 is shown. Electrically conductive coating 12 functions as an electrical resistance heater having a plurality of electrical resistance heating elements.

Electrically conductive coating 12 is connected to a vehicle controller 52 via conventional wiring 54. Controller 52 communicates electrical power electrical signals to electrically conductive coating 12 via conventional wiring 54. Electrically conductive coating 12 generates heat according to Ohm's law as the electrical power electrical signals travel over the electrically conductive coating 12.

The heat is to heat up the body of an occupant of vehicle seat 50. By placing the electrical resistance heating elements in the form of electrically conductive coating 12 into leather cover 10, much lower electrical current is required for the same degree of heating due to the proximity of the leather cover to the seat occupant's body. This provides higher electrical efficiency for heating.

In an embodiment, a single vehicle seat has leather cover 10 with electrically conductive coating 12 in which (i) a first portion of the electrically conductive coating functions as an electrical wire harness and is connected to conventional wiring 34 to thereby be a part of a wire harness system of the vehicle and (ii) a second portion of the electrically conductive coating functions as an electrical resistance heater and is connected to a heating controller of the vehicle.

FIG. 3A illustrates an enlarged view of a portion of electrically conductive coating 12 of leather cover 10 of vehicle seat 50. Electrically conductive coating 12 can be placed as part of the surface finish system or flesh system of leather cover 10 of vehicle seat 50. Placing electrically conductive coating 12 as part of the surface finish side of leather cover 10 (shown in FIG. 1A) results in the greatest electrical efficiency for heating and has no insulation loss from leather layer 14. Placing electrically conductive coating 12 as part of the surface finish side of leather cover 10 (shown in FIG. 1B) results in most uniform heating (diffusion) and higher degree of safety.

As described, electrically conductive coating 12 of leather cover 10 of vehicle seat 50 satisfies the development of an integrated conductive coating for leather finishing system which provides high efficiency heating for seat occupant comfort. Applying a current to a polymer matrix utilizing conductive elements such as graphite, carbon nanotubes, or silver/nickel alloys allows for the generation of heat. This matrix can be applied to leather at specific thicknesses and patterns to optimize resistive element areas. For reference, initial small-scale proof of concept parts provided heating ranges between 70-90° F. utilizing seven volt 0.2-0.3 Amp power consumption without formulation or application optimization.

In an embodiment, electrically conductive coating 12 of leather cover 10 of vehicle seat 50 is integrated within the finishing stack of the leather cover to provide surface resistive heating. Particularly, with reference to FIG. 1A, electrically conductive coating 12 is placed between base coat 16 and color coat 18. Color coat 18 provides system obfuscation (i.e., unseen to vehicle passengers). Top coat 20 has a durable finish and provides an electrical insulative barrier to the seat occupant. The backside of leather layer 14 provides an electrical and thermal barrier to the internal seat construction. The electrical and thermal efficiency of the system is improved by removing thermal mass of leather and laminating insulating materials in traditional seating. A patterned roll application provides precise dimensional patterns and optimized resistivity.

Figure 4:
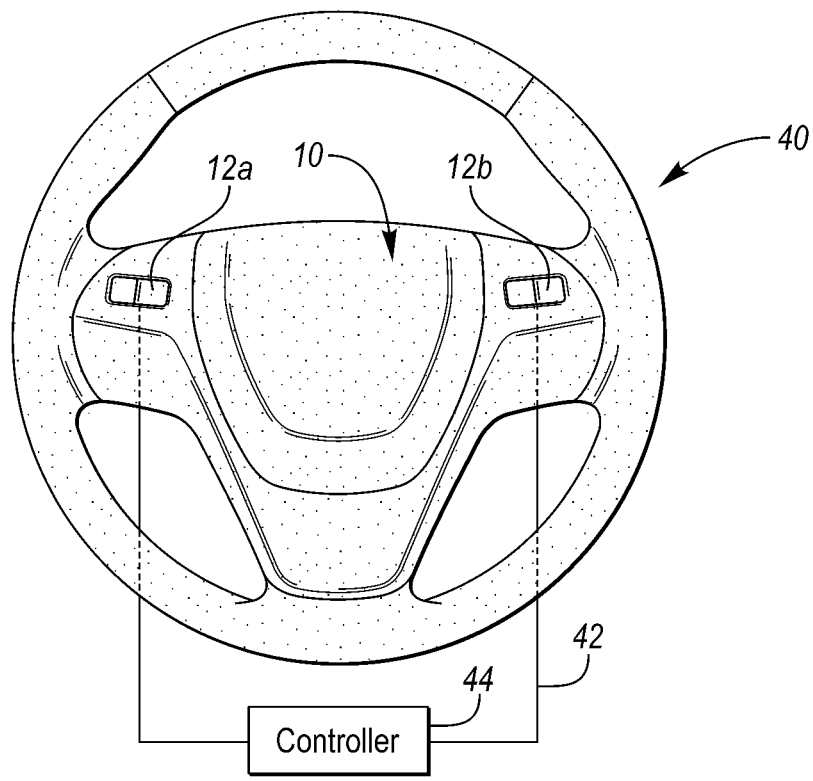
FIG. 4 illustrates a perspective view of a vehicle steering wheel having a leather cover with an electrically conductive coating, the electrically conductive coating functioning as electrically conductive touch controls or switches.

Referring now to FIG. 4, with continual reference to FIGS. 1A and 1B, a perspective view of a vehicle steering wheel 40 having leather cover 10 with electrically conductive coating 12 is shown. Electrically conductive coating 12, for example, includes first and second electrically conductive coating portions 12a and 12b. Electrically conductive coating portions 12a and 12b are positioned at respective locations of steering wheel 40.

Steering wheel 40 is part of a steering system of a vehicle. Electrically conductive coating portions 12a and 12b are respectively connected to conventional wiring 42 extending through the steering system. Electrically conductive coating portions 12a and 12b are connected to a vehicle controller 44 via conventional wiring 42.

A conventional vehicle steering wheel may include built-in control buttons for functions such as cruise control, lights, audio system, etc. In operation, a user of the presses a control button to enact a corresponding function.

Unlike a conventional vehicle steering wheel, steering wheel 40 includes leather cover 10 in place of at least some of the built-in control buttons. As described, leather cover 10 includes a leather layer 14 and electrically conductive coating 12 having electrically conductive coating portions 12a and 12b. Electrically conductive coating portions 12a and 12b function as electrically conductive touch controls or switches. For example, electrically conductive portion 12a functions as a first touch control for enacting a first function and electrically conducive portion 12b functions as a second touch control for enacting a second function. Further, a first portion of electrically conductive portion 12a may function as the first touch control and a second portion of electrically conductive portion 12a may function as another touch control for enacting another function.

In operation, a user presses electrically conductive coating portion 12a (or a part thereof) to enact a corresponding function. Upon the user pressing electrically conductive coating portion 12a, a control electric signal is communicated from the electrically conductive coating portion 12a to vehicle controller 44. In turn, vehicle controller 44 enacts the function. Similarly, a user presses electrically conductive coating portion 12b (or a part thereof) to enact a different corresponding function. Upon the user pressing electrically conductive coating portion 12b, a control electric signal is communicated from the electrically conductive coating portion 12b to vehicle controller 44. In turn, vehicle controller 44 enacts this function.

Figure 5:
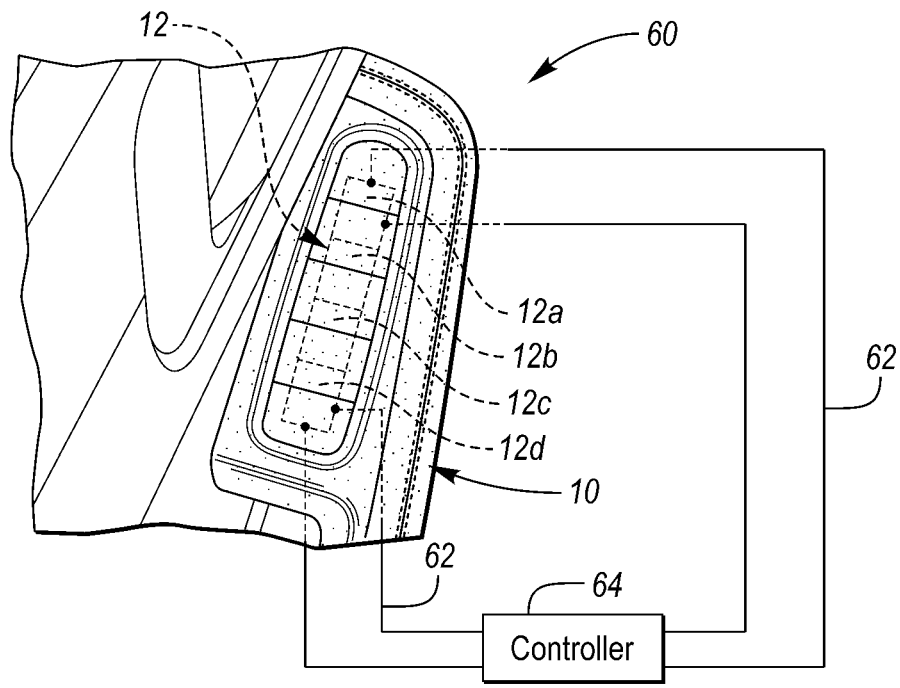
FIG. 5 illustrates a perspective view of a vehicle interior side console having a leather cover with an electrically conductive coating, the electrically conductive coating functioning as electrically conductive touch controls or switches.

Referring now to FIG. 5, with continual reference to FIG. 4, a perspective view of a vehicle interior side console 60 having leather cover 10 with electrically conductive coating 12 is shown. Electrically conductive coating 12 includes, for example, first, second, third, and fourth electrically conductive coating portions 12a, 12b, 12c, and 12d. Electrically conductive coating portions 12a, 12b, 12c, and 12d are positioned at respective locations of vehicle interior side console 60. Electrically conductive coating portions 12a, 12b, 12c, and 12d are respectively connected to vehicle controller 64 via conventional wiring 62. Only the conventional wire connections of electrically conductive coating portions 12a and 12d are shown in FIG. 5 for simplicity.

A conventional vehicle interior side console includes built-in control buttons for functions such as door locks, windows, etc. In operation, a user of the presses a control button to enact a corresponding function. Vehicle interior side console 60 includes leather cover 10 in place of at least some of these built-in control buttons.

Electrically conductive coating portions 12a, 12b, 12c, and 12d function as respective electrically conductive touch controls or switches. For example, electrically conductive portion 12a functions as a driver door lock control, electrically conducive portion 12b functions as a passenger door lock control, electrically conducive portion 12c functions as a driver door window control, and electrically conducive portion 12d functions as a passenger door window control.

In operation, a user presses one of electrically conductive coating portions 12a, 12b, 12c, and 12d to enact the corresponding function. For example, upon the user pressing electrically conductive coating portion 12a, a control electric signal is communicated from the electrically conductive coating portion 12a to vehicle controller 44. In turn, vehicle controller 44 enacts the driver door lock control function corresponding to electrically conductive coating portion 12a.

By utilizing conductive touch layers in the form of electrically conductive coating 12 within leather cover 10 of vehicle interior assemblies like steering wheel 40 and vehicle interior side console 60, control buttons can be incorporated into the design of the leather cover. This opens new areas of the vehicle interior to leather where otherwise inaccessible. Conductive touch layers in the form of electrically conductive coating 12 can also be utilized within leather cover 10 of a vehicle seat for control buttons of the vehicle seat. For instance, electrically conductive coating 12 of a vehicle seat can function as a power control of the vehicle seat.

The controls provided by electrically conductive coating 12 can be back lit with perforation, raised or sunken elements from embossing, or hidden away for a clean style.

In embodiments, electrically conductive coating 12 may function as electroluminescent and/or electrochromic lighting.

In embodiments, electrically conductive coating 12 is applied into leather cover 10 by screen printing; digital printing, extruding, or robotics; roll, spray, or curtain and laser etch; deboss and roll. In the roll, spray, or curtain and laser etch techniques, electrically conductive coating 12 is applied over full hide and elements are etched on demand. The deboss and roll technique directly incorporates texture as part of the design element.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A vehicle seat comprising:
    a seat body;
    a leather cover covering the seat body, the leather cover having a leather layer and an electrically conductive coating applied onto the leather layer;
    wherein the electrically conductive coating is part of a wire harness system of a vehicle with the electrically conductive coating functioning as wiring of the wire harness system and being connected between a first wiring of the wire harness system and a second wiring of the wire harness system to connect the first wiring to the second wiring; and
    control, diagnostic, and/or power electric signals communicated over the wire harness system are communicated through one of the first wiring and the second wiring to the electrically conductive coating and through the electrically conductive coating to the other one of the first wiring and the second wiring.

2. The vehicle seat of claim 1 wherein:
    the electrically conductive coating is applied to a finish side of the leather layer.

3. The vehicle seat of claim 2 wherein:
    the leather cover further includes a base coat on the leather layer, a color coat, and a top coat on the color coat; and
    wherein the electrically conductive coating is between the base coat and the color coat.

4. The vehicle seat of claim 1 wherein:
    the electrically conductive coating is applied to a flesh side of the leather layer.

5. The vehicle seat of claim 4 wherein:
    the leather cover further includes a base coat on a first side of the leather layer, a color coat on the base coat, and a top coat on the color coat; and
    wherein the electrically conductive coating is on a second side of the leather layer, the second side of the leather layer being opposite to the first side of the leather layer.

* * * * *